United States Patent
Rieke et al.

(10) Patent No.: US 10,212,816 B2
(45) Date of Patent: Feb. 19, 2019

(54) HEAT DISSIPATION DEVICE FOR AN ELECTRONIC DEVICE

(71) Applicant: Aptiv Technologies Limited, St. Michael (BB)

(72) Inventors: Matthias Rieke, Moenchengladbach (DE); Volker Klink, Hennef (DE); Florin Badarau-Trescovan, Remscheid (DE)

(73) Assignee: Aptiv Technologies Limited (BB)

( * ) Notice: Subject to any disclaimer, the term of this patent is extended or adjusted under 35 U.S.C. 154(b) by 0 days.

(21) Appl. No.: 15/920,806

(22) Filed: Mar. 14, 2018

(65) Prior Publication Data
US 2018/0288873 A1    Oct. 4, 2018

(30) Foreign Application Priority Data
Mar. 31, 2017 (FR) ...................................... 17 52778

(51) Int. Cl.
*H05K 1/14* (2006.01)
*H05K 1/02* (2006.01)
(Continued)

(52) U.S. Cl.
CPC ........... *H05K 1/147* (2013.01); *H05K 1/0203* (2013.01); *H05K 5/0204* (2013.01);
(Continued)

(58) Field of Classification Search
CPC .. H05K 1/147; H05K 5/0213; H05K 7/20145; H05K 7/20154; H05K 5/0204;
(Continued)

(56) References Cited

U.S. PATENT DOCUMENTS

| 4,149,219 A | 4/1979 | Kraft |
| 4,528,615 A | 7/1985 | Perry |

(Continued)

FOREIGN PATENT DOCUMENTS

| FR | 2863039 | * | 6/2005 | ............ H05B 6/065 |
| WO | 91/05452 A1 | | 4/1991 | |

OTHER PUBLICATIONS

Gouardo, Didier; Goumy, Cedric; Roux Alain, "Heating procedure for cooking vessel placed on cooker hob has series of inductors that detect presence of vessel and switch on appropriate number of heaters", Brandt Ind, Jun. 3, 2005, Entire Document (Translation of FR2863039). (Year: 2005).*

(Continued)

*Primary Examiner* — Anatoly Vortman
*Assistant Examiner* — Stephen S Sul
(74) *Attorney, Agent, or Firm* — Lawrence D. Hazelton

(57) ABSTRACT

An electronic device for a vehicle includes a metal tubular casing extending longitudinally and opening at its two ends, and a wall having a curved profile with cooling fins on its outer surface. The electronic device includes an assembly of printed circuit boards comprising a first plurality of printed circuit boards that include heat-generating electronic components. The printed circuit boards of the assembly are connected together by flexible conductive elements. The device further comprises a first heat sink arranged inside the tubular casing comprising a curved wall generally extending parallel to the curved wall of the tubular casing. The first plurality of printed circuit boards is interposed between the curved inner surface of the wall of the casing and the curved wall of the first heat sink so heat is dissipated through the first heat sink and through the curved wall equipped with cooling fins of the tubular casing.

9 Claims, 3 Drawing Sheets

(51) Int. Cl.
*H05K 5/02* (2006.01)
*H05K 7/14* (2006.01)
*H05K 7/20* (2006.01)
*H05K 1/18* (2006.01)

(52) U.S. Cl.
CPC ......... *H05K 5/0213* (2013.01); *H05K 7/1427* (2013.01); *H05K 7/1434* (2013.01); *H05K 7/20145* (2013.01); *H05K 7/20154* (2013.01); *H05K 7/20854* (2013.01); *H05K 7/20863* (2013.01); *H05K 1/184* (2013.01); *H05K 2201/056* (2013.01); *H05K 2201/058* (2013.01); *H05K 2201/10189* (2013.01); *H05K 2201/10901* (2013.01); *H05K 2201/10939* (2013.01)

(58) Field of Classification Search
CPC ............. H05K 7/20863; H05K 7/1427; H05K 1/0203; H05K 2201/10939; H05K 1/184; H05K 2201/056; H05K 2201/058; H05K 2201/10189; H05K 2201/10901; H05K 7/1434; H05K 7/20163; H05K 1/189; H05K 2201/09018; H05K 1/148; H05K 2201/09809; H05K 2201/064; H01L 25/065; H01L 2924/0002
USPC .............. 361/749, 679.46–679.54, 688–723; 165/80.1; 174/16.1
See application file for complete search history.

(56) References Cited

U.S. PATENT DOCUMENTS

| | | | | |
|---|---|---|---|---|
| 4,928,206 | A * | 5/1990 | Porter | H05K 1/189 165/104.33 |
| 5,884,000 | A * | 3/1999 | Cloud | G02B 6/4446 385/135 |
| 6,778,389 | B1 | 8/2004 | Glovatsky et al. | |
| 6,865,085 | B1 * | 3/2005 | Ferris | H05K 7/20445 165/185 |
| 8,004,844 | B2 * | 8/2011 | Kim | H05K 7/20163 361/716 |
| 8,279,604 | B2 * | 10/2012 | Jones | H01Q 21/20 165/104.33 |
| 9,644,471 | B2 * | 5/2017 | Logan | E21B 47/01 |
| 2005/0007736 | A1 | 1/2005 | Glovatsky et al. | |
| 2007/0240849 | A1 * | 10/2007 | Lin | H01L 23/427 165/80.4 |
| 2010/0259934 | A1 * | 10/2010 | Liu | F21V 29/02 362/294 |
| 2014/0361671 | A1 * | 12/2014 | Degner | G06F 1/20 312/223.2 |
| 2016/0157384 | A1 * | 6/2016 | Liu | H05K 1/028 361/709 |
| 2018/0238500 | A1 * | 8/2018 | Ramaiah | F21V 29/67 |

OTHER PUBLICATIONS

English Translation of the Written Opinion of the International Search Authority for EPO06847123, Aug. 5, 2008. (Year: 2008).*

* cited by examiner

HEAT DISSIPATION DEVICE FOR AN ELECTRONIC DEVICE

TECHNICAL FIELD OF INVENTION

The invention relates to the field of electronic devices for a motor vehicle. More specifically, the invention relates to a heat dissipation device for an electronic device.

BACKGROUND OF INVENTION

Current and forthcoming motor vehicle electronic control units have heightened power density and increasingly compact casing dimensions due to the limited space available in the motor vehicles.

Certain electronic components are components that produce heat. These can be microcontrollers, the data processing speed of which is such that the microcontroller heats up during its operations, or can even be, for example, electronic components distributing high electric currents to the equipment of the vehicle or even simply conductive tracks carrying high currents through the printed circuit board.

In order to cool these components to prevent them from failing, it is known for their heat to be dissipated by directly thermally coupling these components to a thermally conductive casing of the device. In general, in order to ensure continuous thermal coupling, particularly when running the vehicle in which the device is mounted and subject to vibrations, the components are mounted on a printed circuit board arranged at the bottom of the casing, with projecting zones of the casing cover coming into abutment on the components so as to act as a radiator for cooling the components.

It has been established that such devices are bulky. Furthermore, the rigidity of such devices results in failures in the cooled components, particularly broken welds on the components or even damage to the component causing failure thereof.

SUMMARY OF THE INVENTION

An electronic device for a motor vehicle comprises a metal tubular casing extending longitudinally and opening at its two ends, the tubular casing comprising a wall having a curved profile comprising cooling fins on its outer surface. The electronic device further comprises an assembly of printed circuit boards comprising a first plurality of printed circuit boards comprising heat-generating electronic components, the printed circuit boards of the assembly being connected together by flexible conductive elements. The electronic device further comprises a first heat sink arranged inside the tubular casing comprising a curved wall generally extending parallel to the curved wall of the tubular casing. The first plurality of printed circuit boards is interposed between the curved inner surface of the wall of the casing and the curved wall of the first heat sink so as to be able to dissipate the heat through the first heat sink and the curved wall, equipped with cooling fins, of the tubular casing.

The assembly of printed circuit boards can comprise a flat printed circuit board distinct from the first plurality, a first face of said flat printed circuit board being arranged against a flat wall of the first heat sink. The assembly of printed circuit boards can comprise a second plurality of printed circuit boards comprising heat-generating electronic components. The electronic device can comprise a second heat sink comprising another flat wall arranged against the second face of the flat printed circuit board. The second plurality of printed circuit boards can be interposed between the curved inner surface of the wall of the tubular casing and a curved wall of the second heat sink so as to be able to dissipate the heat through the second heat sink and the curved wall, equipped with cooling fins, of the tubular casing.

Each heat sink can comprise other cooling fins extending towards the central axis of the tubular casing. Each heat sink can extend longitudinally against the printed circuit boards of the assembly of printed circuit boards.

The electronic device can comprise a ventilation means arranged at one of the two ends of the tubular casing so as to be able to generate an air flow in the longitudinal direction. The assembly of printed circuit boards can extend longitudinally over the entire length of the casing. The tubular casing can be formed by two half-cylinders, with a circular base and the same dimensions, comprising the cooling fins on their outer surface, the two half-cylinders being arranged one on top of the other so as to form a circular-based cylindrical casing. A printed circuit board can comprise a connector extending outside the tubular casing through the curved wall of the tubular casing. The connector can comprise pins assembled on the flat circuit board, the body of the connector being arranged through an opening of the curved wall of the casing.

Further features and advantages will appear more clearly on a reading of the following detailed description of the preferred embodiment, which is given by way of non-limiting example only and with reference to the accompanying drawings.

BRIEF DESCRIPTION OF DRAWINGS

Further features, aims and advantages of the invention will become apparent upon reading the following detailed description, and with reference to the accompanying drawings, which are provided by way of a non-limiting example and in which.

DETAILED DESCRIPTION

Figure 1:
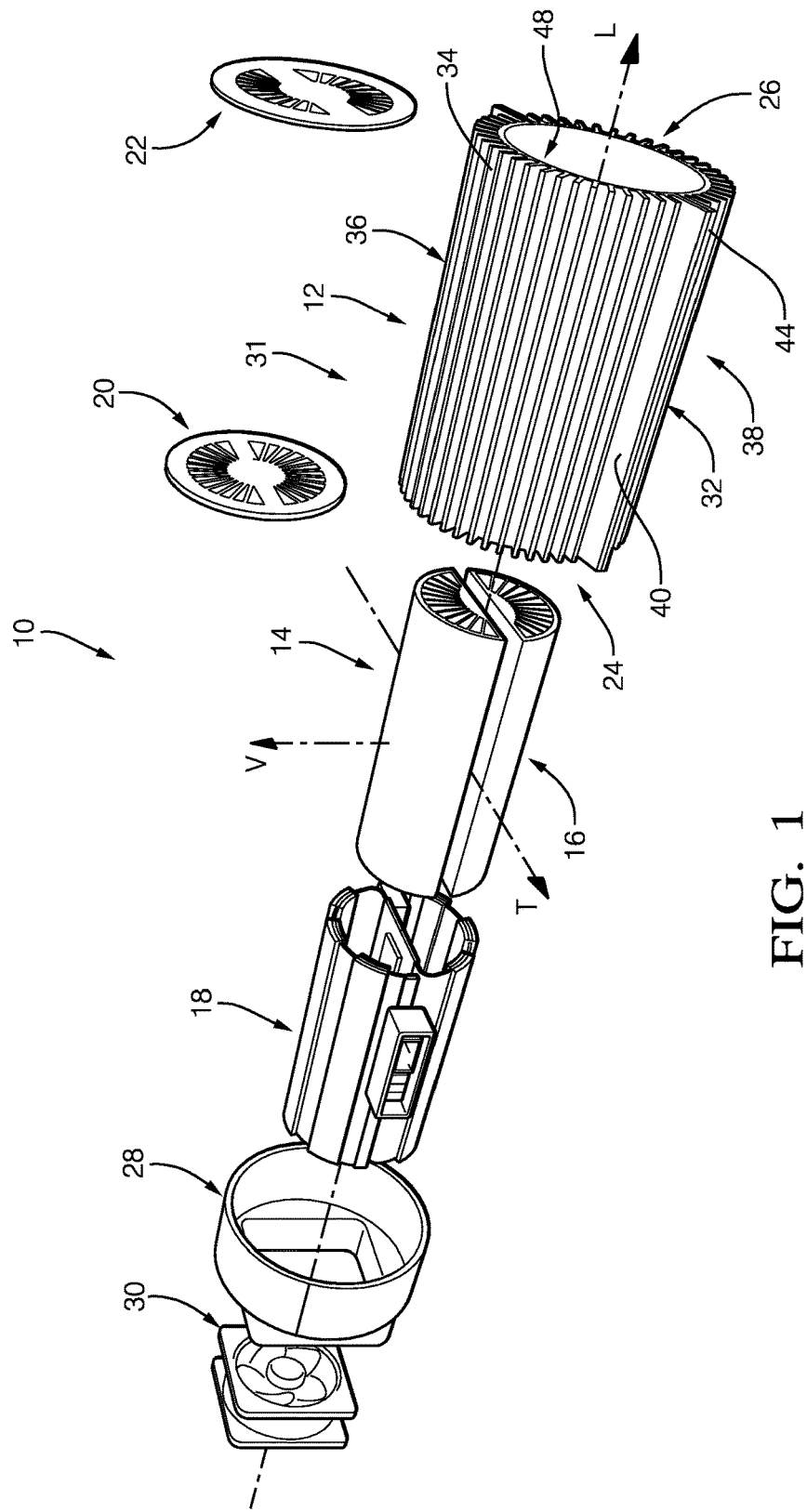
FIG. 1 is an exploded perspective schematic view of the electronic device according to the invention.

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

'One or more' includes a function being performed by one element, a function being performed by more than one element, e.g., in a distributed fashion, several functions being performed by one element, several functions being performed by several elements, or any combination of the above.

It will also be understood that, although the terms first, second, etc. are, in some instances, used herein to describe various elements, these elements should not be limited by these terms. These terms are only used to distinguish one element from another. For example, a first contact could be termed a second contact, and, similarly, a second contact could be termed a first contact, without departing from the scope of the various described embodiments. The first contact and the second contact are both contacts, but they are not the same contact.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]," depending on the context.

In order to facilitate the description, and in a non-limiting manner, an orthogonal coordinate system is defined that comprises a longitudinal axis L, a transverse axis T and a vertical axis V. "Low", "high", "top", "bottom", "lower" and "upper" orientations are defined in the vertical direction.

According to FIG. 1, an electronic device 10 for a motor vehicle comprises a tubular casing 12 extending along the longitudinal axis L, a first heat sink 14 and a second heat sink 16 designed to be arranged inside the tubular casing 12. The electronic device further comprises an assembly 18 of printed circuit boards 18 comprising at least one electronic component 19 (shown in FIG. 3) capable of generating heat, the assembly of printed circuit boards 18 being designed to be interposed between the tubular casing 12 and each heat sink 14, 16. The electronic device 10 further comprises a first ventilation grille 20 and a second ventilation grille 22 designed to be arranged at each end 24, 26 of the tubular casing 12.

The electronic device 10 further comprises a fan support 28 designed to be arranged against the first ventilation grille 20 and also a fan 30 designed to be arranged in its support 28 and designed to generate an air flow in the longitudinal direction.

Figure 2:
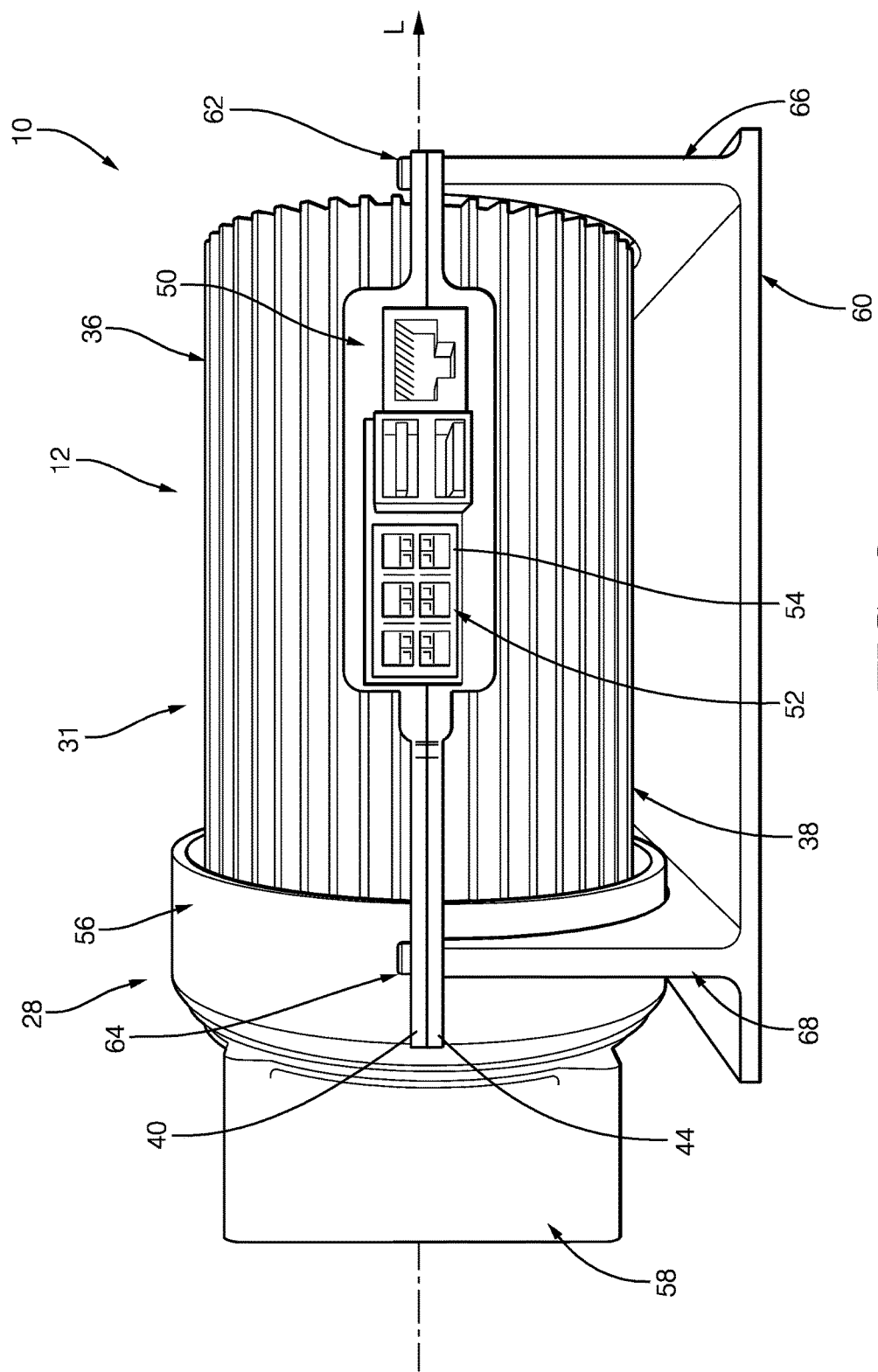
FIG. 2 is a perspective schematic view of the assembled electronic device of FIG. 1.

According to FIG. 1 and FIG. 2, the tubular casing 12 is a hollow cylinder opening at each of its two ends 24, 26. More specifically, the tubular casing 12 is of cylindrical shape with a circular base.

The outer surface 32 of the wall 31 of the tubular casing 12 is equipped with cooling fins 34 also extending longitudinally. Even though it can be produced as one piece, according to the embodiment shown, the tubular casing 12 is formed by two assembled half-cylinders 36, 38. The assembly is produced by means of two first fixing fins 40, 42 (see FIG. 4) arranged either side of the outer surface 32 of one of the half-cylinders 36 and fixed to two second fixing fins 44, 46 arranged either side of the outer surface 32 of the other half-cylinder 38. The fixing fins 40, 42, 44, 46 are similar to the cooling fins 34, since they are also metal and extend in a similar manner. However, they extend more extensively in a direction orthogonal to the tubular casing 12 so as to be able to arrange fixing means therein, such as screws, for example.

The inner surface 48 of the wall 31 of the tubular casing 12 is generally smooth. The curvature of the inner surface 48 of the wall 31 of the tubular casing 12 is generally circular.

According to the embodiment shown in FIG. 2, the tubular casing 12 further comprises an opening 50 allowing electrical connectors 52 to be arranged that are designed to be electrically connected to the assembly of printed circuit boards 18. The opening 50 is arranged at the joint of the two half-cylinders 36, 38 of the tubular casing 12. The opening 50 is generally of complementary shape to the body 54 of the electrical connectors 52. The opening 50 thus creates a discontinuity on the fixing fins 40, 44. The fan support 28 is a part comprising a generally cylindrical circular-based part 56 arranged around the tubular casing 12 and a generally cylindrical rectangular-based part 58, in which the fan 30 is arranged. The fan 30 is arranged directly facing the first ventilation grille 20 so as to be able to generate an air flow passing through the tubular casing 12 in the longitudinal direction and thus promoting the circulation of the flow of cooling air. According to the direction of the air flow, the hot air generated by the heat-generating electronic component is extracted through the second ventilation grille 22.

Furthermore, according to FIG. 2, the electronic device is mounted on a support or base 60 for fixing purposes. More specifically, the fixing fins 40, 44 of the tubular casing 12 comprise openings 62, 64, into which fixing studs 66, 68 of the base 60 are inserted.

The fixing means 66, 68 shown in FIG. 2 have no limiting effect on the invention. Other means for fixing the electronic device 10 in a vehicle can be contemplated. The tubular casing 12 can, for example, comprise fixing lugs on its outer surface 32 allowing the electronic device 10 to be mounted directly in the vehicle and thus without an additional base 60.

Figure 3:
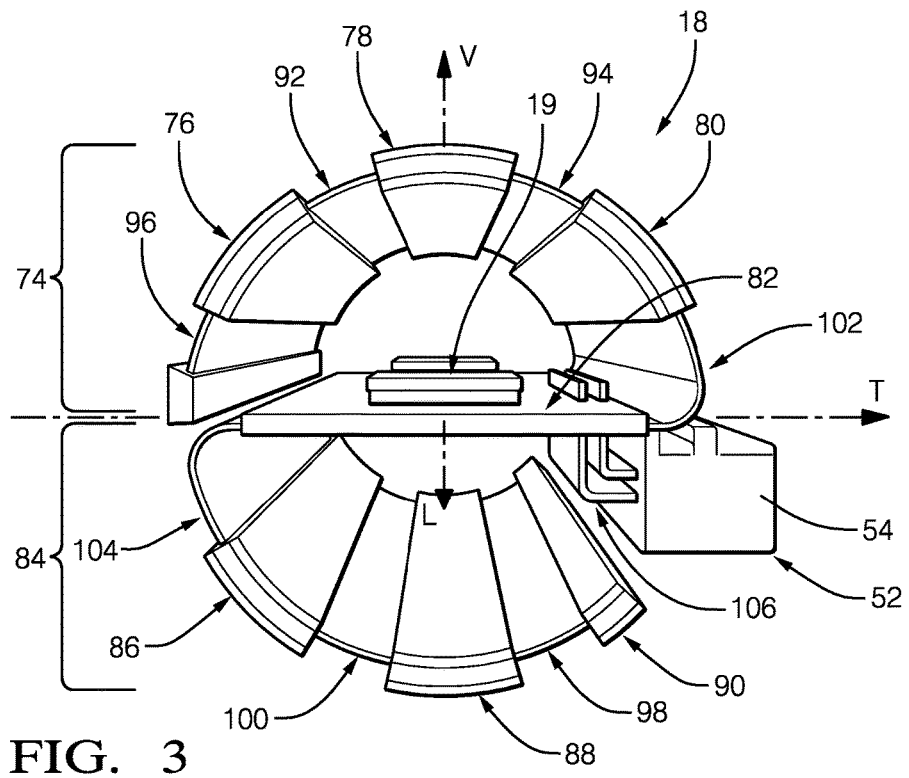
FIG. 3 is a perspective schematic view of the assembly of printed circuit boards of the electronic device of FIG. 1.

According to FIG. 1 and FIG. 3, the assembly of printed circuit boards 18 comprises a first plurality 74 of printed circuit boards 76, 78, 80 electrically connected to a flat printed circuit board 82 arranged along a horizontal plane defined by the longitudinal axis L and the transverse axis T. The assembly of printed circuit boards 18 further comprises a second plurality 84 of printed circuit boards 86, 88, 90 electrically connected to the flat printed circuit board 82.

The printed circuit boards 76, 78, 80 of the first plurality 74, as well as the printed circuit boards 86, 88, 90 of the second plurality 84, are flexible printed circuit boards consecutively arranged one after the other. The printed circuit boards 76, 78, 80 of the first plurality 74 consecutively arranged one after the other, as well as the printed circuit boards 86, 88, 90 of the second plurality 84 consecutively arranged one after the other, are connected together by flexible conductive elements 92, 94, 96, 98, 100, such as layers of electric wires or even by flexible printed circuit boards (also known as Flex-PCB) generally comprising a plastic substrate. The printed circuit boards 76, 78, 80 of the first plurality 74, as well as the printed circuit boards 86, 88, 90 of the second plurality 84, thus comprise printed circuit boards 76, 78, 80, 86, 88, 90 that are flexible enough to be able to be arranged against the inner surface 48 of the tubular casing 12.

The first plurality 74 of printed circuit boards 76, 78, 80 is thus arranged in a curved manner above the flat printed circuit board 82. The second plurality 84 of printed circuit boards 86, 88, 90 is thus also arranged in a curved manner below the flat printed circuit board 82.

The flat printed circuit board 82 is generally of rectangular shape. A first edge of the flat printed circuit board 82 is electrically connected to the printed circuit board 80 of the first plurality 74 closest to said first edge by another flexible conductive element 102. A second edge of the flat printed circuit board 82, opposite the first edge, is electrically connected to the printed circuit board 86 of the second plurality 84 closest to said second edge by yet another flexible conductive element 104 distinct from that of the first edge.

The printed circuit boards 76, 78, 80, 82, 86, 88, 90 of the assembly of printed circuit boards 18 are of generally rectangular shape and extend longitudinally along the entire length of the tubular casing 12. The printed circuit boards 76, 78, 80 of the first plurality 74, the printed circuit boards 86, 88, 90 of the second plurality 84 and the flat printed circuit board 82 can be equipped with heat-generating electronic components 19. Preferably, electronic components that are sensitive to a mechanical stress resulting from the bending of the printed circuit boards are arranged on the flat printed circuit board 82. For example, and in a non-limiting manner, the electronic components in the casing that comprise ball grid arrays (BGA casing) preferably will be mounted on the flat printed circuit board 82. Other heat-generating components that are less sensitive to the mechanical stress of the printed circuit boards, such as, for example, power switches of the surface-mounted component type and of the D2PAK casing type, comprising a metal connection base plate and a series of connection pins, can be arranged on the flexible printed circuit boards 76, 78, 80 of the first plurality 74 and of the second plurality 84 of printed circuit boards.

According to FIG. 3, the electrical connector 52 is arranged on the flat printed circuit board 82. The pins 106 of the connector 52 are angled pins, thus allowing the body 54 of the connector 52 to be arranged through the opening 50 of the cylindrical wall 31 of the tubular casing 12. The ends of the pins 106 of the connector 52, outside its body 54, are mounted on the flat printed circuit board 82. They can be either soldered or even forcibly inserted into the flat printed circuit board 82.

It is also possible for the printed circuit boards 76, 78, 80, 86, 88, 90 of the first and the second plurality 74, 84 to be equipped with straight electrical connectors, i.e. with straight, non-angled pins, so that the casings of the straight connectors can be arranged through other openings of the wall of the tubular casing 12.

Figure 4:
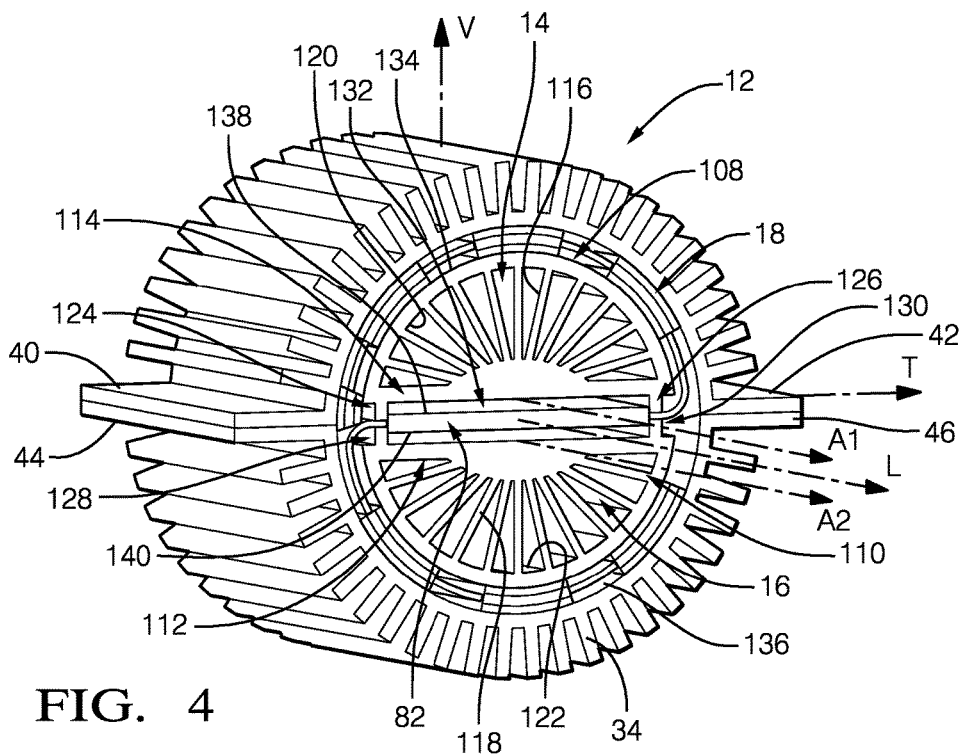
FIG. 4 is a schematic view of the assembly of printed circuit boards arranged in the tubular casing of the electronic device of FIG. 1.

In order to facilitate the description of the arrangement of the assembly of printed circuit boards 18 in the tubular casing 12, the illustration of FIG. 4 does not show the connectors 52 shown in FIG. 2 and FIG. 3.

According to FIG. 1 and FIG. 4, the first heat sink 14 and the second heat sink 16 are half-cylinders extending longitudinally along a length similar to that of the tubular casing 12.

Each heat sink 14, 16 comprises a half-cylindrical wall 108, 110 and a flat wall 112, 114 connecting each end of the half-cylindrical wall 108, 110. Each heat sink 14, 16 comprises other cooling fins 116, 118 generally evenly distributed on the inner surface 120, 122 of the half-cylindrical wall 108, 110 and extending, on the one hand, longitudinally along the entire length of the half-cylindrical wall 108, 110 and, on the other hand, from the inner surface 120, 122 of each half-cylindrical wall 108, 110 of said heat sinks 14, 16 towards the central axis L of the tubular casing 12. More specifically, the other cooling fins 116, 118 extend, on the other hand, from the inner surface 120, 122 of each half-cylindrical wall 108, 110 of said heat sinks 14, 16 towards the central axis A1, A2 of the half-cylinder of said heat sink 14, 16.

The first and the second heat sink 14, 16 are arranged mirror-like one against the other so as to generally form a cylindrical-shaped, circular-based heat sink assembly. The flat wall 114 of the first heat sink 14 is thus arranged facing the flat wall 112 of the second heat sink 16 and parallel thereto.

According to FIG. 4, the flat walls 112, 114 of the heat sinks 14, 16 are spaced apart from each other by pillars 124, 126, 128, 130, thus creating a space 132, in which the flat printed circuit board 82 is arranged. The top face 138 and the bottom face 140 of the flat printed circuit board 82 are respectively in abutment on the flat wall 114 of the first heat sink 14 and on the flat wall 112 of the second heat sink 16. The space 132 between the flat printed circuit board 82 and the flat walls 112, 114 of the heat sinks 14, 16 can be filled with thermal paste, which ensures that the flat printed circuit board 82 is in abutment against the two flat walls 112, 114.

The curvature radius of each half-cylindrical wall of the heat sinks 14, 16 is designed so that each plurality 74, 84 of printed circuit boards is interposed between the inner surface 48 of the tubular casing 12 and the outer surface 134, 136 of the half-cylindrical wall 108, 110 of the heat sinks 14, 16. In other words, the first plurality 74 of printed circuit boards 76, 78, 80 and the second plurality 84 of printed circuit boards 86, 88, 90 are respectively in abutment against the outer surface 134, 136 of the half-cylindrical wall 108, 110 of the first heat sink 14 and of the second heat sink 16 and also in abutment against the inner surface 48 of the tubular casing 12.

In order to limit the mechanical stress on the printed circuit boards 76, 78, 80, 86, 88, 90 of the first and of the second plurality 74, 84, the first and the second heat sinks 14, 16 can comprise flats facing flats arranged on the inner surface 48 of the tubular casing 12. The printed circuit boards 76, 78, 80, 86, 88, 90 of the first and of the second plurality 74, 84 can be interposed between the flats of the heat sinks 14, 16 and the flats of the inner surface 48 of the tubular casing 12 so as not to become curved.

The invention also can be provided as various alternatives particularly using the principle of interposing printed circuit boards between the curved inner surface of a metal casing and the curved outer surface of a curved heat sink, the curved shape thus obtained of the electronic device allowing printed circuit boards to be arranged between two metal structures and allowing optimal thermal dissipation, the curved shape of the electronic device allowing space to be saved for such a device.

While this invention has been described in terms of the preferred embodiments thereof, it is not intended to be so limited, but rather only to the extent set forth in the claims that follow.

We claim:

1. An electronic device (10) for a motor vehicle comprising:
   a tubular casing (12) formed of metal, said tubular casing extending longitudinally with openings at each of two ends (24, 26) of the tubular casing, the tubular casing (12) comprising a wall (31) having a curved profile comprising cooling fins (34) on an outer surface (32) of the tubular casing;

an assembly of printed circuit boards (18) comprising a first plurality of printed circuit boards characterized as flexible, said first plurality of printed circuit boards comprising heat-generating electronic components (19), the printed circuit boards of the assembly being connected together by flexible conductive elements (92, 94);

a first heat sink (14) arranged inside the tubular casing (12) comprising a curved wall (108) generally extending parallel to the wall (31) of the tubular casing (12);

the first plurality of printed circuit boards being interposed between a curved inner surface (48) of the wall (31) of the casing (12) and the curved wall (108) of the first heat sink (14) so as to be able to dissipate the heat through the first heat sink (14) and through the curved wall (31) equipped with cooling fins (34) of the tubular casing (12); and the assembly of printed circuit boards (18) comprising a flat printed circuit board (82) distinct from the first plurality of printed circuit boards, a first face (138) of said flat printed circuit board (82) being arranged against a flat wall (114) of the first heat sink (14).

2. The electronic device (10) according to claim 1, wherein the assembly of printed circuit boards (18) comprises a second plurality (84) of flexible printed circuit boards (86, 88) comprising heat-generating electronic components (19);

a second heat sink (16) comprises another flat wall (112) arranged against the second face (140) of the flat printed circuit board (82);

the second plurality (84) of printed circuit boards (86, 88) is interposed between the curved inner surface (48) of the wall (31) of the tubular casing (12) and a curved wall (110) of the second heat sink (16) so as to be able to dissipate the heat through the second heat sink (16) and through the curved wall (31) equipped with cooling fins (34) of the tubular casing (12).

3. The electronic device (10) according to claim 1, wherein each heat sink (14, 16) comprises other cooling fins (116, 118) extending towards the central axis (L) of the tubular casing (12).

4. The electronic device (10) according to claim 1, wherein each heat sink (14, 16) extends longitudinally against the printed circuit boards of the assembly of printed circuit boards (18).

5. The electronic device (10) according to claim 1, further comprising a ventilation means (30) arranged at one of the two ends (24, 26) of the tubular casing (12) so as to be able to generate an air flow in the longitudinal direction.

6. The electronic device (10) according to claim 1, wherein the assembly of printed circuit boards (18) extends longitudinally over the entire length of the tubular casing (12).

7. The electronic device (10) according to claim 1, wherein the tubular casing (12) is formed by two half-cylinders (36, 38), with a circular base and having the same dimensions, comprising the cooling fins (34) on their outer surface (32), the two half-cylinders (36, 38) being arranged one on top of the other so as to form a circular-based cylindrical casing.

8. The electronic device (10) according to claim 1, wherein the flat printed circuit board (82) comprises a connector (52) extending outside the tubular casing (12) through the curved wall (31) of the tubular casing (12).

9. The electronic device (10) according to claim 8, wherein the connector (52) comprises pins (106) assembled on the flat printed circuit board (82), the body (54) of the connector (52) being arranged through an opening (50) of the curved wall (31) of the casing (12).

* * * * *